(12) United States Patent
Moldovan et al.

(10) Patent No.: US 7,034,644 B2
(45) Date of Patent: Apr. 25, 2006

(54) NON-CONTACT AUXILIARY SWITCH AND ELECTRIC POWER APPARATUS INCORPORATING SAME

(75) Inventors: Peter K. Moldovan, Cascade, WI (US); Edward L. Wellner, Colgate, WI (US); Michael R. Larsen, Milwaukee, WI (US); Paul J. Rollmann, Brown Deer, WI (US); Xin Zhou, Brookfield, WI (US); John R. Skibinski, Hubertus, WI (US); Randal D. Gazdecki, Monaca, PA (US)

(73) Assignee: Eaton Corporation, Cleveland, OH (US)

( * ) Notice: Subject to any disclaimer, the term of this patent is extended or adjusted under 35 U.S.C. 154(b) by 491 days.

(21) Appl. No.: 10/335,664

(22) Filed: Jan. 2, 2003

(65) Prior Publication Data

US 2004/0130217 A1 Jul. 8, 2004

(51) Int. Cl.
*H01H 9/00* (2006.01)
(52) U.S. Cl. .................................. 335/205; 335/17
(58) Field of Classification Search ........ 335/205–207, 335/165–179, 132, 17; 361/113
See application file for complete search history.

(56) References Cited

U.S. PATENT DOCUMENTS

| 3,720,891 | A | * | 3/1973 | Nicol ........................... 335/13 |
| 4,912,439 | A | | 3/1990 | Nagy et al. |
| 5,424,900 | A | * | 6/1995 | Kiiskinen et al. ........... 361/116 |
| 5,466,974 | A | | 11/1995 | Sutrina et al. |
| 5,612,579 | A | | 3/1997 | Wisbey et al. |
| 6,326,871 | B1 | | 12/2001 | Freimuth |

* cited by examiner

*Primary Examiner*—Lincoln Donovan
(74) *Attorney, Agent, or Firm*—Martin J. Moran

(57) ABSTRACT

The auxiliary switch includes a non-contact sensor, such as a Hall effect device, that is switched by the condition of a magnetic field. The magnetic field condition is effected by a movable contact indicator that moves between open and closed positions with the separable contacts of the electric power apparatus. A magnet may be attached to the movable contact indicator, or the movable contact indicator can be magnetized to form the magnet. Alternatively, the moving contact indicator can intercept or not intercept a magnetic field produced by a fixed magnet spaced from the sensor. The Hall effect device may be mounted on the outside of the nonmagnetically permeable housing of the electric power apparatus, or inside if there is sufficient room. In either case, no mechanical coupling is required for the sensor.

14 Claims, 3 Drawing Sheets

NON-CONTACT AUXILIARY SWITCH AND ELECTRIC POWER APPARATUS INCORPORATING SAME

BACKGROUND OF THE INVENTION

1. Field of the Invention

This invention relates to a switch that signals a specified condition of the electric power apparatus, and more particularly to a non-contact switch that includes a sensor requiring no mechanical actuation by the apparatus, and to an electric power apparatus incorporating such a switch.

2. Background Information

Electric power apparatus, such as circuit breakers, transfer switches, network protectors, and the like, often are equipped with auxiliary switches that provide signals indicating certain conditions within the apparatus. These include switches that indicate whether the contacts are open or closed and whether the device has been tripped open. The signals generated by the switches can be used for communicating the condition to a remote location.

Typically, these auxiliary switches are mechanically actuated, usually through physical contact with or a linkage to the operating mechanism that opens and closes the contacts. Many of the electric power apparatuses have sufficient room inside a housing to accommodate the auxiliary switches, or the housing includes a compartment containing the switch. Some electric power apparatuses are physically too small or otherwise do not have sufficient space available for the auxiliary switch within the housing. In such circumstances, these mechanically actuated switches can be contained within their own housing mounted on the outside of the apparatus housing. However, this requires an opening in the housing for the mechanical linkage. There is, therefore, room or improvement.

SUMMARY OF THE INVENTION

This invention relates to a non-contact auxiliary switch for electric power apparatus. Such a non-contact auxiliary switch can have the sensor generating an electrical output signal mounted on the outside of the apparatus housing, although it could also be located within the case housing when sufficient internal space is available. When the sensor is responsive to a magnetic field, no mechanical connection with the operating mechanism of the apparatus is required. Thus, the sensor can be mounted on the outside of the apparatus housing without the need for an opening through the housing.

The magnetically responsive sensor can be a Hall effect device, in which a magnetic field of sufficient strength perpendicular to current flow through the device, switches its effective impedance.

The auxiliary switch of the invention includes, in addition to the magnetic sensor, a magnet and a moving piece attached to or part of the operating mechanism of the apparatus and which moves with the contacts between open and closed positions. The magnet can be carried by the moving piece, or alternatively, the moving piece can be magnetized to form the magnet. In these embodiments of the invention, the magnetic field is perpendicular to current flow through the Hall effect device in one position of the movable piece and sufficiently non-perpendicular in a second position to cause switching of the sensor.

In another embodiment of the invention, the moving piece is mounted between the magnet and the sensor, and either attenuates or does not attenuate the magnetic field reaching the Hall effect device.

More particularly, the invention is directed to a non-contact auxiliary switch for an electric power apparatus comprising a housing containing separable contacts and an operating mechanism operating the separable contacts between open and closed positions. The auxiliary switch comprises a magnet generating a magnetic field, a Hall effect device responsive to first and second conditions of the magnetic field to generate first and second outputs signals, and a moving piece coupled to and moved by the operating mechanism between a closed position when the contacts are closed to effect one of the first and second conditions of the magnetic field, and an open position when the contacts are open to effect the other of the first and second conditions of the magnetic field.

As another aspect of the invention, an electric power apparatus includes a housing, separable contacts inside the housing, an operating mechanism inside the housing for opening and closing the separable contacts, and having a moving piece movable with the separable contacts between corresponding open and closed positions, and a non-contact sensor outside the housing responsive to movement of the moving piece inside the housing between the open and closed positions to generate an auxiliary signal indicating the open and closed position of the moving piece, and therefore, of the separable contacts.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
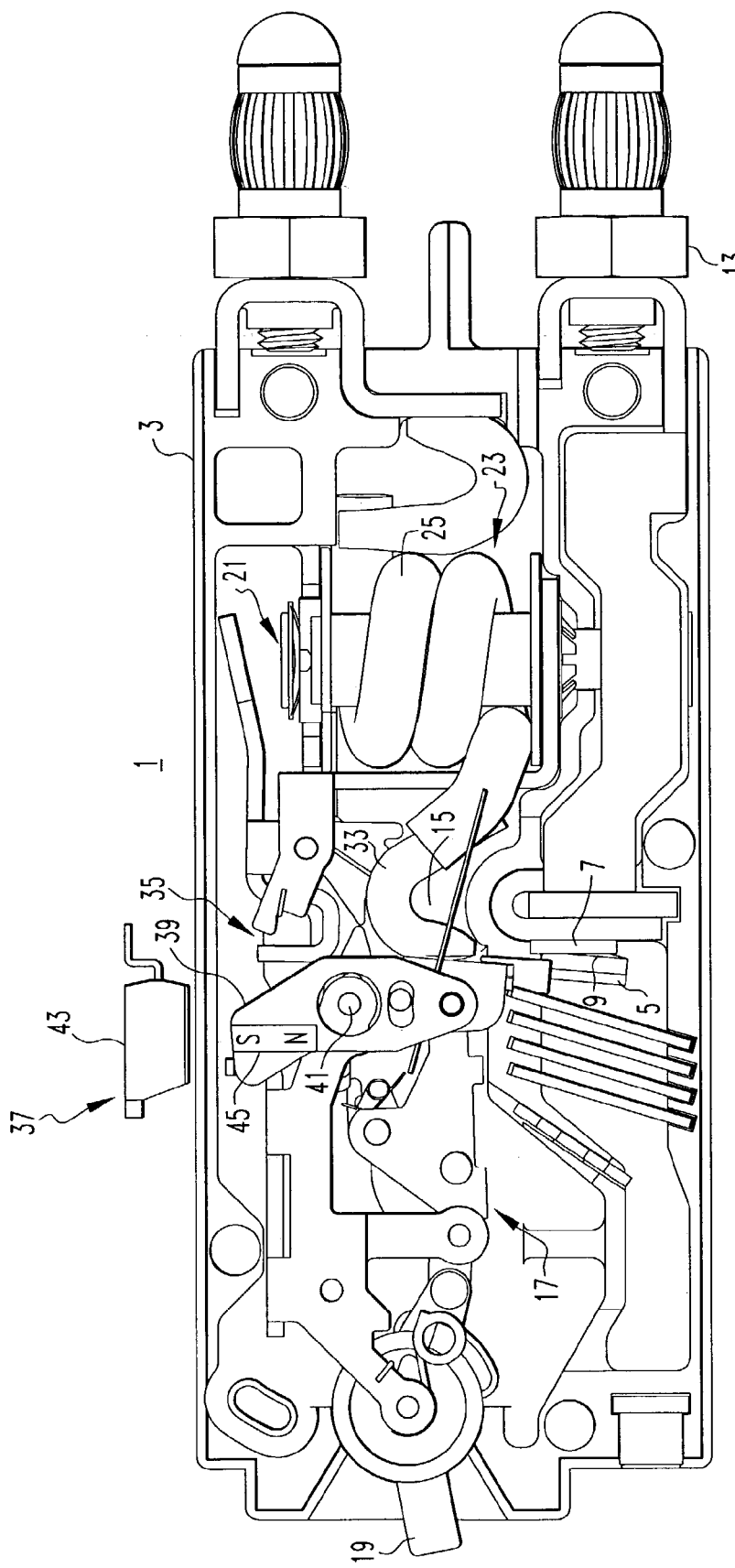
FIG. 1 is a longitudinal sectional view through a circuit breaker shown in the closed state and incorporating a first embodiment of the invention.

The invention will be described as applied to a circuit breaker, but it will be apparent that it has application to other electric power switching apparatus. Referring to FIG. 1, the circuit breaker 1 has a molded housing 3. Within the housing is a set of separable contacts 5 formed by a fixed contact 7 and a movable contact 9. The fixed contact 7 is mounted on a load conductor 11 which extends outside of the housing 3 where it terminates in a load terminal 13. The movable contact 9 is mounted on a movable contact arm 15, which forms part of an operating mechanism 17. The operating mechanism 17 includes a handle 19 which can be used to manually move the movable contact arm 15 between a closed position shown in FIG. 1 in which the separable contacts 5 are closed and an open position shown in FIG. 2 in which the separable contacts are open.

The operating mechanism 17 can also be actuated automatically by a trip mechanism 21. In the exemplary circuit breaker 1, this trip mechanism 21 is an electromagnetic device that responds to overcurrent conditions. This magnetic trip mechanism 21 includes a trip solenoid 23 having a trip coil 25 and an armature 27. The trip coil 25 is connected to a line terminal 29 through a line conductor 31 and through a braided conductor 33 to the movable contact arm 15. Thus, with the separable contacts 5 closed, a current path through the circuit breaker 1 includes the line terminal 29, the line conductor 31, the trip coil 25, the braided wire 33, the movable contact arm 15, the closed separable contacts 5, the load conductor 11, and the load terminal 13.

The trip mechanism 21 also includes a latch 35 between the armature 27 and the operating mechanism 17. An overcurrent of a specified magnitude flowing through the trip coil 25, generates a magnetic field strong enough to attract the armature 27 to trip the operating mechanism 17, which opens the separable contacts 5.

In accordance with the invention, a non-contact auxiliary switch 37 is provided for remote signaling of the open/closed state of the separable contacts 5. This non-contact auxiliary switch 37 includes a moving piece or movable contact indicator 39 coupled to and moved by the operating mechanism 17. This movable contact indicator 39 is pivoted about a mounting pin 41 between a closed position shown in FIG. 1 corresponding to the closed position of the separable contacts 5 and an open position shown in FIG. 2 corresponding to the similar open position of the separable contacts 5.

Figure 2:
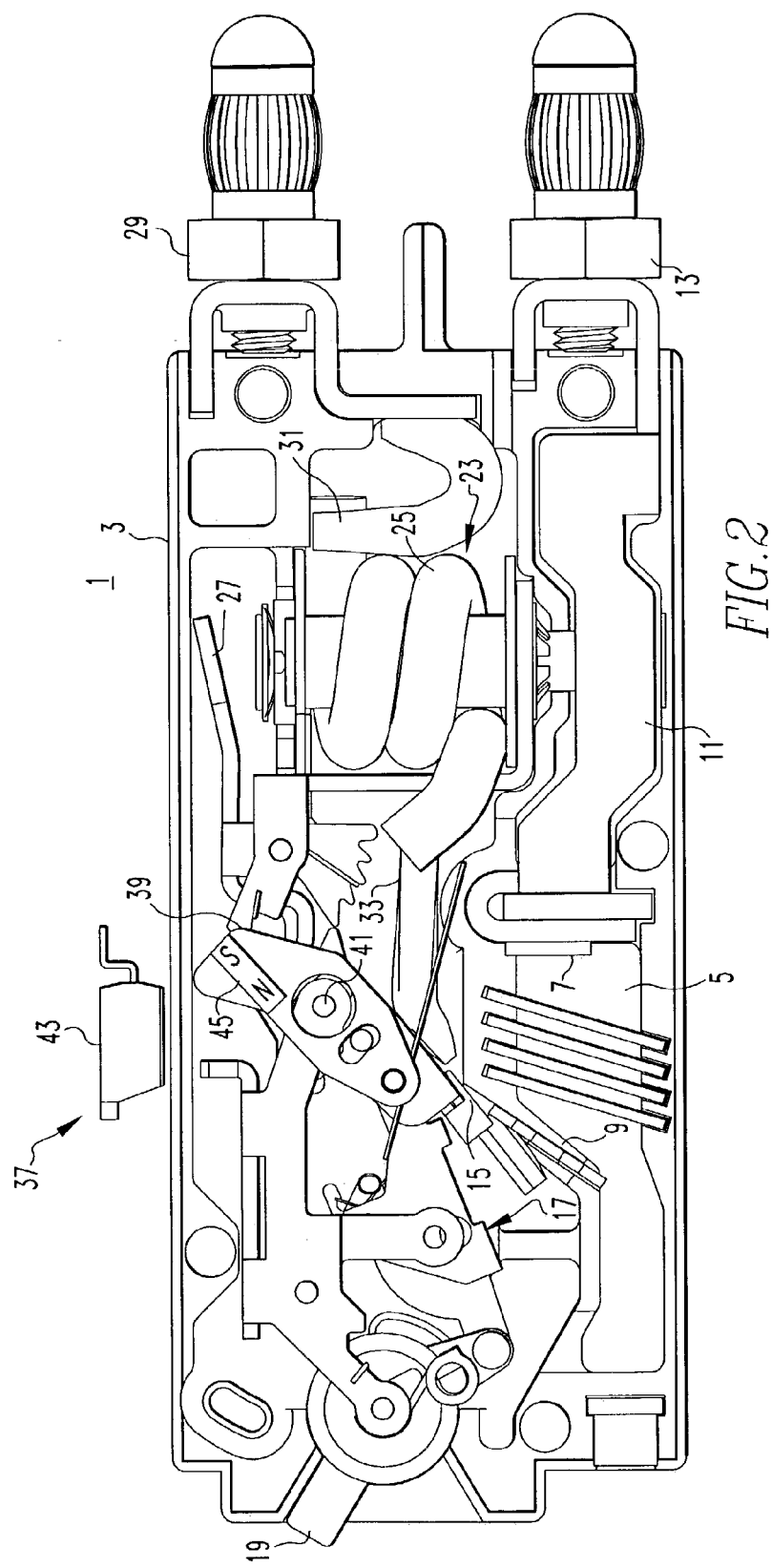
FIG. 2 is a view similar to FIG. 1 showing the circuit breaker in the open state.

The non-contact auxiliary switch 37 also includes a magnetic field responsive sensor, which in the exemplary embodiment of the invention is a Hall effect device 43. Hall effect devices are well known. A magnetic field of sufficient magnitude perpendicular to sensor current through the device produces a transverse potential differential across the current flow which is used to generate an output signal. The auxiliary switch 37 also includes a magnet 45 which generates the magnetic field. The Hall effect device 43 includes circuitry that produces a first output when the transverse potential is below a certain value and second output when it is above that value. The first output is produced when the magnetic field impinging on the Hall effect device 43 has a first condition and the second output of the Hall effect device is generated when the impinging magnetic field has a second condition. The condition of the magnetic field impinging on the Hall effect device 43 is effected by the movable contact indicator 39. In the embodiment of the invention shown in FIGS. 1 and 2, the magnet 45 is carried by the movable contact indicator 39. In FIG. 1 the magnet 45 is positioned by the movable contact indicator 39 in close proximity to the Hall effect device 43 where it produces one of the first and second magnetic field conditions. When the separable contacts 5 are open as shown in FIG. 2, the movable contact indicator 39 is rotated so that the magnet 45 is displaced from close proximity to the Hall effect device 43 producing a second condition of the magnetic field impinging on the Hall effect device. The switching in the output of the Hall effect device can be produced with a rotation of the movable contact indicator 39 through an angle α of at least about 15°. An angle α of 90° provides the greatest difference between the first and second conditions of the magnetic field impinging on the Hall effect device 43, but requires a large physical movement of the contact indicator 39. A practicable value for α balances these two factors to achieve good differentiation of the first and second magnetic field conditions through physical movement of the contact indicator 39. In the exemplary embodiment of the invention, α is about 50°. Alternatively, the movable contact indicator 39 can be magnetized to form the magnet 45.

Figure 3:
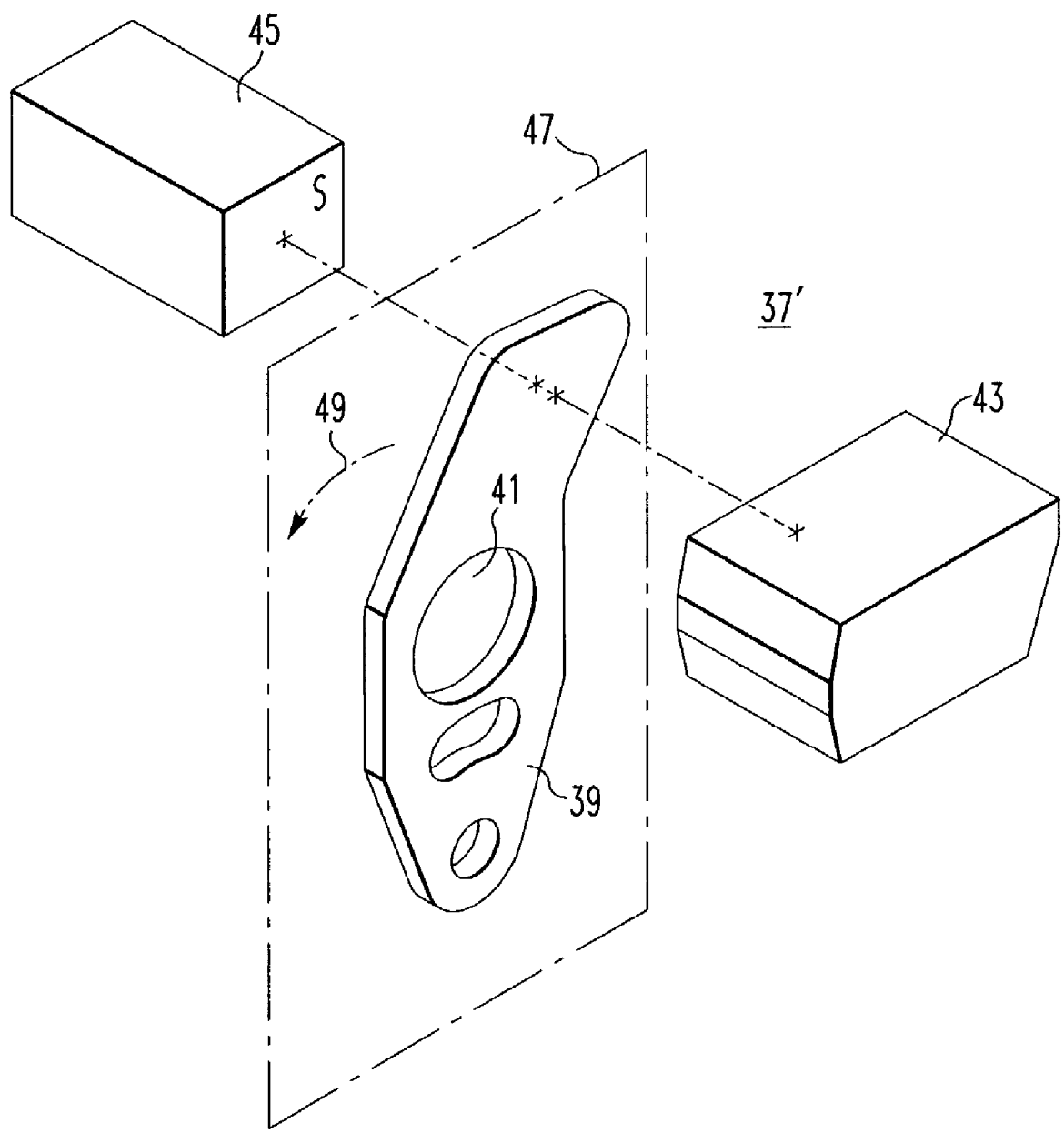
FIG. 3 is a schematic isometric view of another embodiment of a non-contact auxiliary switch in accordance with the invention.

In another embodiment of a switch 37' in accordance with the invention shown schematically in FIG. 3, the magnet 45 is mounted in fixed, spaced apart alignment with the Hall effect device 43. In this arrangement, the movable contact indicator 39 moves in a plane 47 substantially perpendicular to a line 49 between the magnet 45 and the Hall effect device 43. With the magnetically permeable movable contact indicator 39 blocking the direct path between the magnet 45 and the Hall effect device 43, as shown in FIG. 3 in full line, one of the conditions of the magnetic field, in which the magnitude impinging on the Hall effect device is reduced, is produced. With the movable contact indicator 39 moved out of the direct line between the magnet 45 and the Hall effect device 43, such as by rotation about the pin 41 as shown by the arrow 49, the second condition of the magnetic field is produced in which the intensity of the field is increased. This arrangement requires a more sensitive, and therefore, more expensive, Hall effect device than the embodiments described above in which the orientation of the field is changed.

In all the embodiments of the invention, no mechanical connection is required to actuate the sensor 43, and since the magnetic field can penetrate the resinous housing 3 of the circuit breaker 1, the Hall effect device 43 can be mounted on the outside of the housing without any opening in the housing for a mechanical linkage. The non-contact auxiliary switch could also be implemented with the Hall effect sensor 43 inside the housing where sufficient room is available. If desired, a cover (not shown), could be provided over the Hall effect device 43 mounted on the outside of the circuit breaker housing 3.

What is claimed is:

1. Electric power apparatus comprising:
   a housing;
   separable contacts inside the housing;
   an operating mechanism inside the housing for opening and closing the separable contacts; and
   an auxiliary switch comprising:
      a moving piece inside the housing movable with the separable contacts between corresponding open and closed positions; and
      a non-contact sensor outside the housing responsive to movement of the moving piece inside the housing between the open and closed positions to generate an auxiliary signal indicating the open and closed positions of the moving piece, and therefore of the separable contacts,
      wherein no mechanical linkage or coupling is connected between the moving piece inside the housing and the non-contact sensor outside the housing.

2. The electric power apparatus of claim 1, wherein the auxiliary switch further comprises a magnet inside the housing generating a magnetic field and the non-contact sensor comprises a magnetic field responsive device outside the housing generating first and second outputs in response to first and second conditions of the magnetic field, and wherein the moving piece inside the housing effects one of the first and second conditions of the magnetic field when in the open position and the other of the first and second conditions of the magnetic field in the closed position.

3. The electric power apparatus of claim 2, wherein the magnetic field responsive device outside the housing is a Hall effect device outside the housing.

4. The electric power apparatus of claim 3, wherein the magnet inside the housing is carried by the moving piece inside the housing.

5. The electric power apparatus of claim 4, wherein the moving piece inside the housing is magnetized to form the magnet inside the housing.

6. Electric power apparatus comprising: a housing:
separable contacts inside the housing:
an operating mechanism inside the housing for opening and closing the separable contacts; and
an auxiliary switch comprising:
    a moving piece movable with the separable contacts between corresponding open and closed positions;
    a non-contact sensor outside the housing responsive to movement of the moving piece inside the housing between the open and closed positions to generate an auxiliary signal indicating the open and closed positions of the moving piece, and therefore of the separable contacts; and
    a magnet generating a magnetic field,
    wherein the non-contact sensor comprises a Hall effect device generating first and second outputs in response to first and second conditions of the magnetic field,
    wherein the moving piece is separated from the magnet and effects one of the first and second conditions of the magnetic field when in the open position and the other of the first and second conditions of the magnetic field in the closed position, and
    wherein the moving piece moves between the open and closed positions in a plane substantially perpendicular to the magnetic field and between the magnet and the Hall effect device.

7. The electric power apparatus of claim 6, wherein the moving piece rotates between the open and closed positions.

8. The electric power apparatus of claim 7 wherein the moving piece rotates at least about 15° between the open and closed positions.

9. The electric power apparatus of claim 8, wherein the moving piece rotates at least about 50° between the open and closed positions.

10. The electric power apparatus of claim 9, wherein the moving piece rotates about 50° between the open and closed positions.

11. A non-contact auxiliary switch for electric power apparatus comprising a housing containing separable contacts and an operating mechanism operating the separable contacts between open and closed positions, the auxiliary switch comprising:
    a magnet mounted inside the housing and generating a magnetic field;
    a Hall effect device mounted outside the housing and being responsive to first and second conditions of the magnetic field to generate first and second output signals; and
    a moving piece inside the housing and being coupled to and moved by the operating mechanism between a closed position when the separable contacts are closed to effect one of the first and second conditions of the magnetic field and an open position when the separable contacts are open to effect the other of the first and second conditions of the magnetic field.

12. The auxiliary switch of claim 11, wherein the magnet mounted inside the housing is carried by the moving piece inside the housing.

13. The auxiliary switch of claim 11, wherein the moving piece inside the housing is magnetized to form the magnet mounted inside the housing.

14. The auxiliary switch of claim 11, wherein the magnet mounted inside the housing is spaced from the Hall effect device mounted outside the housing and the moving piece inside the housing moves into and out of alignment with a line between the magnet mounted inside the housing and the Hall effect device mounted outside the housing.

* * * * *